United States Patent
Yang et al.

(10) Patent No.: US 9,366,482 B2
(45) Date of Patent: Jun. 14, 2016

(54) ADJUSTABLE HEAT PIPE THERMAL UNIT

(71) Applicant: INTEL CORPORATION, Santa Clara, CA (US)

(72) Inventors: Jin Yang, Hillsboro, OR (US); David Shia, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 610 days.

(21) Appl. No.: 13/631,957

(22) Filed: Sep. 29, 2012

(65) Prior Publication Data

US 2014/0090816 A1    Apr. 3, 2014

(51) Int. Cl.
| | |
|---|---|
| *F28D 15/02* | (2006.01) |
| *H01L 23/433* | (2006.01) |
| *H01L 23/40* | (2006.01) |
| *H01L 23/427* | (2006.01) |
| *H01L 23/00* | (2006.01) |
| *F28F 13/00* | (2006.01) |

(52) U.S. Cl.
CPC ............ *F28D 15/02* (2013.01); *F28D 15/0241* (2013.01); *H01L 23/427* (2013.01); *H01L 23/4338* (2013.01); *H01L 24/72* (2013.01); *F28F 2013/005* (2013.01); *F28F 2280/08* (2013.01); *H01L 2224/16225* (2013.01); *H01L 2224/73251* (2013.01); *H01L 2224/73253* (2013.01); *H01L 2924/0002* (2013.01); *H01L 2924/3511* (2013.01)

(58) Field of Classification Search
CPC ............ F25D 2021/0028; F28D 15/02; F28D 15/0275; F28D 15/028; F28D 15/0233; F28D 15/0241; H01L 23/433; H01L 23/40; H01L 23/427; H01L 23/4338; H01L 2023/4068
See application file for complete search history.

(56) References Cited

U.S. PATENT DOCUMENTS

| | | | |
|---|---|---|---|
| 5,944,093 A * | 8/1999 | Viswanath | ........... F28D 15/0241 165/104.26 |
| 6,189,601 B1 | 2/2001 | Goodman et al. | |
| 6,519,153 B1 | 2/2003 | Shia et al. | |
| 6,522,545 B2 | 2/2003 | Shia et al. | |
| 6,542,367 B2 | 4/2003 | Shia et al. | |
| 6,639,799 B2 | 10/2003 | Prasher et al. | |
| 6,661,660 B2 | 12/2003 | Prasher et al. | |
| 6,926,955 B2 | 8/2005 | Jayaraman et al. | |
| 7,042,727 B2 | 5/2006 | Ulen et al. | |
| 7,589,962 B1 | 9/2009 | Bhatia | |
| 7,766,691 B2 | 8/2010 | Pandey et al. | |
| 7,805,955 B2 | 10/2010 | Mongia | |
| 7,846,778 B2 | 12/2010 | Rumer et al. | |
| 8,891,235 B2 | 11/2014 | Walczyk et al. | |
| 2004/0052052 A1 * | 3/2004 | Rivera | ................... H01L 23/427 361/700 |
| 2005/0117305 A1 | 6/2005 | Ulen et al. | |
| 2006/0087816 A1 * | 4/2006 | Ewes et al. | ...................... 361/704 |
| 2007/0131387 A1 * | 6/2007 | Kawabata et al. | ............ 165/80.3 |
| 2009/0071632 A1 * | 3/2009 | Bryant | ................ F28D 15/0241 165/104.26 |
| 2011/0249400 A1 * | 10/2011 | Watanabe | ................ G06F 1/203 361/695 |

* cited by examiner

*Primary Examiner* — Frantz Jules
*Assistant Examiner* — Erik Mendoza-Wilkenfe
(74) *Attorney, Agent, or Firm* — Konrad Raynes Davda & Victor LLP; Alan S. Raynes

(57) ABSTRACT

Assemblies and methods are described. One assembly includes a first plate and a second plate. The assembly also includes an adjustable heat pipe positioned between the first plate and the second plate, the adjustable heat pipe being in thermal contact with the first plate and the second plate. In another aspect, a plurality of springs may be positioned between the first plate and the second plate. Other embodiments are described and claimed.

20 Claims, 3 Drawing Sheets

ADJUSTABLE HEAT PIPE THERMAL UNIT

BACKGROUND

As electronic devices become smaller and more complex, heat dissipation becomes a significant issue in a variety of situations, such as testing.

BRIEF DESCRIPTION OF THE DRAWINGS

Embodiments are described by way of example, with reference to the accompanying drawings, which are not necessarily drawn to scale.

DETAILED DESCRIPTION

In order to show features of various embodiments most clearly, the drawings included herein include a representation of various electronic and/or mechanical devices. The actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

Certain embodiments relate to a system for thermal control including a thermal unit comprising a main plate and one or more contact plates coupled to the main plate through springs, and adjustable heat pipes positioned between the contact plates and the main plate to facilitate heat transfer therebetween.

Figure 1:
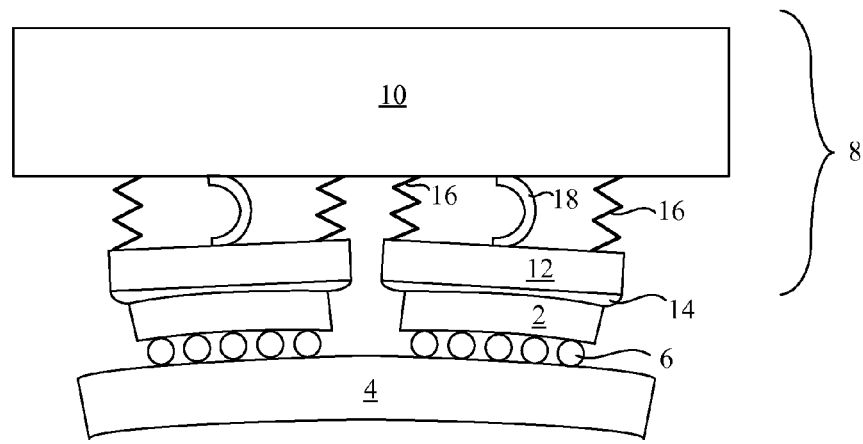
FIG. 1 illustrate a thermal unit positioned on die structures on a warped substrate, in accordance with certain embodiments.

FIG. 1 illustrates an assembly used to regulate the temperature of one or more die structures 2 positioned on a substrate 4 through solder connections 6. In order to control the temperature of the die structures 2, a thermal unit assembly 8 is thermally coupled to the die structures 2. Typically the thermal unit 8 is used to transfer heat away from the die structures 2. The thermal unit 8 as illustrated in FIG. 1 includes a main plate 10 and a plurality of contact plates 12. The contact plates 12 are brought into thermal contact with the die structures 2. In certain embodiments a thermal interface material 14 may be positioned between the contact plates 12 and the die structures 2, if desired. Any suitable thermal interface material, including, but not limited to, metals, polymers, composites, and greases, may be utilized. Between the contact plates 12 and the main plate 10 are positioned springs 16 and heat pipes 18. The springs 16 may act to absorb and apply force to position the contact plates 12 into satisfactory thermal contact with the die structures 2. The heat pipes 18 may act to transfer heat from the contact plates 12 to the main plate 10 and vice-versa, so that the temperature of the die structures 2 may be controlled. The heat pipes 18 may also act to accommodate the movement of the contact plate and springs when they adjust to different die heights.

The heat pipes 18 are be configured to be adjustable so that a good thermal contact can be maintained despite variations in the vertical position of a surface or of adjacent surfaces. Both the heat pipes 18 and springs 16 provide sufficient compliance to accommodate die height (vertical position) variations. Such variations may occur for a number of reasons, including, but not limited to, manufacturing variations, warpage or deformations arising during testing. Such variations may result, for example, in die structures having a curved surface or multiple die structures having different heights.

As illustrated in FIG. 1, the substrate 4 and die structures 2 are somewhat warped. By use of the springs 16 and heat pipe 18, the contact plates 12 are able to achieve satisfactory thermal contact with the surface of the die structure 2 (through the thermal interface material 14) despite the warped die surface. To establish good thermal communication with the devices to be tested, and to counteract warpage, a force may be applied through the contact plate to the die structures 2. The application of such force may act to at least partially flatten out the die structures 2 (and the substrate 4) and enable a better thermal contact to be made between the contact plates 12 and the die structures 2.

Figure 2:
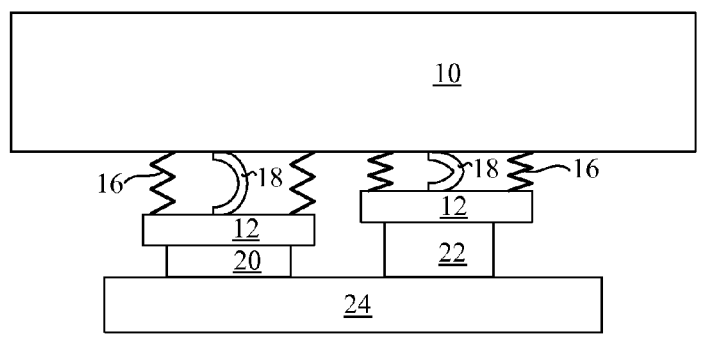
FIG. 2 illustrates a thermal unit positioned on die structures having different heights, in accordance with certain embodiments.

FIG. 2 illustrates the thermal unit of FIG. 1 positioned on die structures 20, 22 on substrate 24. Any suitable connection between the die structures 20, 22 and substrate 24 may be utilized. The die structure 20 has a shorter height than the die structure 22. Good thermal contact is made by the contact plates 12 due to the ability of the springs 16 and heat pipe 18 to flex and adjust to the height of the particular die structure 20, 22. As seen in FIG. 2, the springs 16 and the heat pipe 18 on the contact plate 12 on the die structure 22 on the right side of FIG. 2 are more compressed than the springs 16 and heat pipe 18 on the contact plate 12 on the die structure 20 on the left side of FIG. 2, to account for the higher vertical position of the die structure 22. Though not illustrated in FIG. 2, in certain embodiments a thermal interface material such as the thermal interface material 14 illustrated in FIG. 1 may be used between the contact plates 12 and the die structures 20, 22, if desired.

Figure 3:
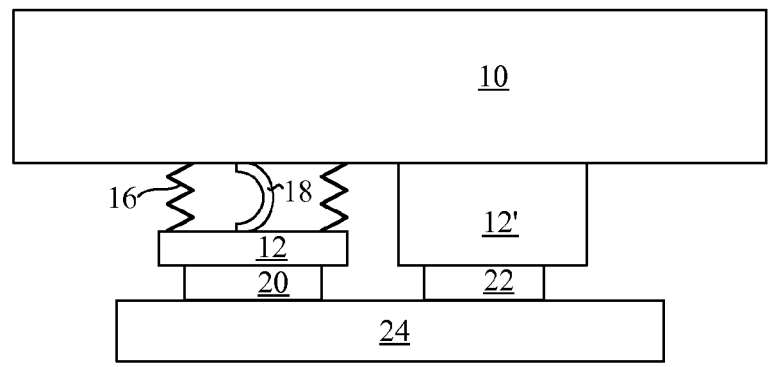
FIG. 3 illustrates a thermal unit positioned on die structures using contact plates, in accordance with certain embodiments.

FIG. 3 illustrates a thermal unit in which different configurations of contact plates are used. Contact plate 12 includes an adjustable heat pipe and spring structure. Contact plate 12' does not utilize a heat pipe to thermally couple to the main plate 10. Instead, the contact plate 12' itself is thermally coupled to the main plate using any suitable coupling mechanism including, but not limited to, bolting it to the main plate 10 or using an adhesive to connect it to the main plate 10. In certain embodiments, a thermal interface material such as the thermal interface material 14 of FIG. 1 may be positioned between the contact plate 12' and the main plate 10, if desired. Such a configuration, with some contact plates 12 utilizing a heat pipe 18, and other contact plates 12' not using a heat pipe 18 and instead being directly coupled to the main plate, may find application in situations such as testing operations in which one die is under different conditions from another die and as a result, different heat transfer mechanisms are used. For example, one die may be subjected to higher power during testing operations and may generate a temperature condition in which a more direct heat transfer method (such as that illustrated in FIG. 3) may be used. By having adjacent die structures utilize the adjustable heat pipe and spring configuration (as in FIG. 3), variations in die structure height may be accounted for.

Embodiments may include varying numbers of contact plates 12, springs 16, and heat pipes 18. By having individual contact plates 12 that are independently actuated and can adjust to changes in die height, effective temperature regulation of die structures at different heights, for example, in a package such as a multi-chip electronic package (MCP), can be carried out simultaneously because each contact plate can make a stable mechanical and thermal contact with the die, regardless of differences in die height (vertical position) or changes in the die height. This enables testing of such MCP packages to be efficiently carried out.

The main plate 10 may comprise any suitable structure for transferring heat and may in certain embodiments be formed from a block of material such as a nickel (Ni) coated copper (Cu) plate. The main plate 10 may have pathways positioned therein for fluid flow and may also include various components for controlling the temperature therein.

The contact plates 12, 12' may comprise any suitable structure for transferring heat and may in certain embodiments also be formed from a block of material such as Ni coated Cu. The springs 16 may be formed from any suitable material, including, but not limited to, metals. The heat pipes 18 may comprise any suitable structure for transferring heat and may in certain embodiments be formed from a Cu tube having a heat transfer mechanism therein. One example of such a heat transfer mechanism is a fluid (for example, water) positioned within the tube that can boil, travel up the tube towards the main plate, then cool and condense near the main plate and drip back down the tube towards the contact plate. Certain embodiments may also include a wicking structure within the tube. Other configurations for the heat pipes 18 are also possible, and the structure does not necessarily have to be tubular.

As illustrated in FIGS. 1-2, for example, the heat pipes 18 may be substantially C-shaped. This shape enables the heat pipes 18 to be adjustable and flex in response to a force applied thereto. Using FIG. 2 as an example, the flexibility allows the heat pipes 18 to adjust their vertical position in response to a change in the vertical position of one of the die structures 20, 22. For example, during a test procedure die 22 may reach a higher temperature than die 20. In response to the higher temperature, the thermal expansion of the die 22 itself, or the thermal expansion mismatch with the underlying package may cause the upper surface of substrate 22 may be at a higher vertical position than the upper surface of substrate 20. The flexibility of the heat pipes 18 (and springs 16 in FIG. 2) permits the plate 12 to adjust vertically and maintain a good thermal connection even with the change in vertical position of the upper surface of the substrate 22. This self-adjusting feature permits adjacent plates 12 to move independently of one another to account for differences in the vertical position of the underlying surface. Thus, in adjacent die structures, if one has a different vertical position due to manufacturing variations, or has a changing vertical position during a testing procedure, such differences can be accounted for using the assembly including the adjustable heat pipes 18 positioned between the main plate 10 and contact plates 12 as described above.

In certain embodiments, the heat pipe 18 operates within the assembly over a range of distances of up to about 1 mm. Using the structure illustrated in FIGS. 1-2 as an example, in certain embodiments a change in the distance between the main plates 10 and the contact plates 12 of up to 1 mm may occur, which means that the vertical position of either of the illustrates contact plates 12 can change up to 1 mm to allow adjustment for differences in the vertical position of either of the die structures 2. In certain embodiments, the structure of the heat pipe itself permits it to compress (flex) over a range of distances up to 1 mm and greater.

Figure 4:
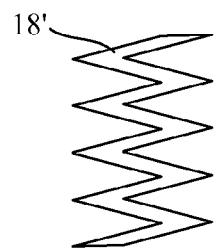
FIG. 4 illustrates a heat pipe, in accordance with certain embodiments.

While certain embodiments utilize a substantially C-shaped heat pipe 18, other shapes for the heat pipe are also possible, including, but not limited to, a helical or spring shape 18' as illustrated in FIG. 4. To ensure good thermal communication with a device, a force may be applied to hold the contact plate on the device. In certain embodiments, most or all of a mechanical force is applied through the springs 16. Such force may vary and in certain embodiments may be up to 100 pounds or more. As noted above in connection with FIG. 1, such forces may also counteract warpage and act to flatten out the device.

Figure 5:
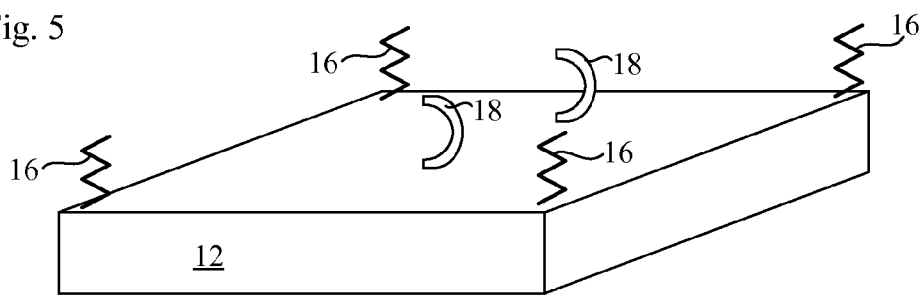
FIG. 5 illustrates a contact plate including a plurality of springs and heat pipes thereon, in accordance with certain embodiments.

FIG. 5 illustrates a contact plate 12 having a plurality of springs 16 and a plurality of heat pipes 18 positioned thereon, in accordance with certain embodiments. Any number of springs 16 may be used in various embodiments, and the springs may take any suitable shape. As illustrated in FIG. 5, the springs 16 may in certain embodiments be positioned at the corner regions of the contact plate 12. Other positions are also possible.

The springs may in certain embodiments be attached to one or both of the contact plate 12 and the main plate 10 (as seen in FIGS. 1-2) using any suitable attachment mechanism. Alternatively, in certain embodiments the springs may be positioned on but not physically attached to the contact plate 12 or the main plate 10. The springs 16 are configured to be able to apply substantial mechanical force and to provide compliance for achieving a good thermal contact between the contact plate 12 and the underlying devices. In certain embodiments, a heat pipe 18 may be used alone (no springs 16) between the main plate 10 and the contact plate 12. Such an embodiment may be used, for example, if a relatively small amount of force is needed.

Figure 6:
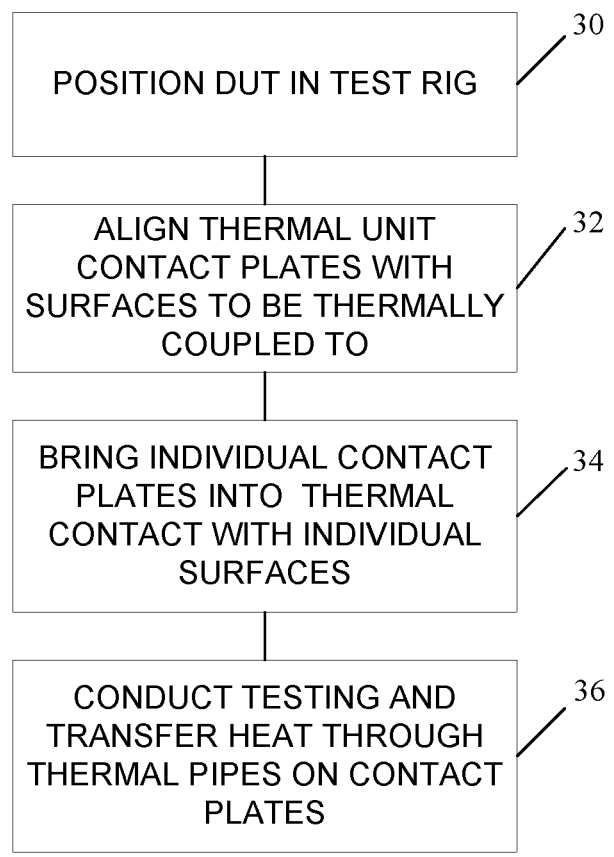
FIG. 6 illustrates a flow chart of process operations for forming an assembly, in accordance with certain embodiments.

Thermal unit assemblies such as described above may be useful in a variety of applications, including device testing. Embodiments as described herein enable efficient testing of thin electronic packages including, for example, sub-200 micron thick core packages and coreless packages that include multiple die structures. FIG. 6 illustrates a flowchart of operations for performing a test procedure using a thermal unit in accordance with certain embodiments. Box 30 is positioning the device or devices to be tested (known as device under test or DUT) in a test unit. Box 32 is aligning the contact plates in the thermal unit with individual surfaces of the devices to be tested. For example, the individual surfaces may be die surfaces such as illustrated in FIGS. 1-2. Box 34 is bringing individual contact plates into thermal contact with the individual surfaces. A mechanical force may be applied to ensure a good thermal contact is made and to counteract any curvature such as that due to warpage. Box 36 is conducting testing and using the thermal unit to regulate the temperature by, for example, conducting excess heat away from the DUT's through the heat pipes. It should be appreciated that various additions, subtraction, and/or modifications may be made to the above operations described in connection with FIG. 5, within the scope of various embodiments.

In one example thermal unit assembly, a Cu heat pipe approximately 9 mm long and 4 mm in diameter was used. Water was used as a working fluid in the Cu heat pipe. The Cu heat pipe was attached to both the main plate and the contact plate, with approximately 4 mm of the heat pipe on each end being used for the attachment to the main plate and to the contact plate. Under an operating temperature of 60° C., the maximum heat removal capability was approximately 150 watts.

It should be appreciated that many changes may be made within the scope of the embodiments described herein. For example, in certain embodiments heat may be supplied to a DUT from the thermal unit. The term die as used herein refers to a workpiece that is transformed by various process operations into a desired electronic device. A die is usually singulated from a wafer, and may be made of semiconducting, non-semiconducting, or combinations of semiconducting and non-semiconducting materials. Terms such as "first", "second", and the like, if used herein, do not necessarily denote any particular order, quantity, or importance, but are used to distinguish one element from another. Terms such as "top", "bottom", "upper", "lower", "over", "under", "vertical" and the like, if used herein, are used for descriptive purposes and to provide a relative position and are not to be construed as limiting. Embodiments may be manufactured, used, and contained in a variety of positions and orientations.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate preferred embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. An assembly comprising:
   a substrate including a first die structure and a second die structure positioned thereon;
   a first plate;
   a second plate positioned on the first die structure, the second plate positioned between the first plate and the first die structure;
   a third plate positioned on the second die structure, the third plate positioned between the second die structure and the first plate; and
   an adjustable heat pipe positioned between the first plate and the second plate, the adjustable heat pipe being substantially C-shaped, the adjustable heat pipe being in thermal contact with the first plate and the second plate.

2. The assembly of claim 1, further comprising a plurality of springs positioned between the first plate and the second plate.

3. The assembly of claim 1, wherein the adjustable heat pipe comprises a tubular structure.

4. The assembly of claim 1, wherein the adjustable heat pipe defines a distance between the first plate and the second plate, and wherein the distance is adjustable in a range of up to 1 mm.

5. The assembly of claim 1, wherein the adjustable heat pipe is attached to the first plate and attached to the second plate.

6. The assembly of claim 2, wherein the second plate is rectangular in shape and includes a first surface facing the first plate, the first surface including four corner regions. the plurality of springs includes a spring positioned in each corner region.

7. The assembly of claim 1, wherein the adjustable heat pipe is adapted to transfer heat from the second plate to the first plate.

8. The assembly of claim 1, further comprising a thermal interface material positioned between the first die structure and the second plate.

9. The assembly of claim 1, wherein the third plate has a height that is greater than that of the second plate.

10. The assembly of claim 1, wherein the second die structure has a height that is greater than that of the first die structure, and wherein a distance between the first plate and the second plate is greater than a distance between the first plate and the third plate.

11. An assembly comprising:
    a substrate including first and second die structures thereon;
    a first plate spaced apart from the substrate and the first and second die structures;
    a second plate positioned between the first die structure and the first plate;
    a third plate positioned between the second die structure and the first plate;
    a first heat pipe positioned between the first plate the second plate;
    a second heat pipe positioned between the first plate and the third plate;
    a first thermal interface material layer positioned between the first die structure and the second plate;
    a second thermal interface material layer positioned between the second die structure and the third plate;
    a first plurality of springs positioned between the first plate and the second plate;
    a second plurality of springs positioned between the first plate and the third plate; and
    the first plate configured to extend over an entire width of the second plate and the third plate.

12. The assembly of claim 11, further comprising a third heat pipe positioned between the first plate and the second plate.

13. The assembly of claim 11, wherein the first heat pipe and the second heat pipe are each substantially C-shaped.

14. The assembly of claim 11, wherein the first heat pipe comprises a tubular structure, and wherein the first heat pipe defines a distance between the first plate and the second plate, and wherein the distance is adjustable in a range of up to 1 mm.

15. An assembly comprising:
    a substrate including first and second die structures positioned thereon;
    a first plate;
    a second plate positioned on the first die structure, the second plate positioned between the first plate and the first die structure;
    an adjustable heat pipe positioned between the first plate and the second plate; and
    a third plate positioned on the second die structure, the third plate positioned between the first plate and the second die structure, the third plate having a height that is greater than that of the second plate, the third plate thermally coupled to the first plate in the absence of an adjustable heat pipe therebetween.

16. The assembly of claim 15, wherein the adjustable heat pipe is substantially C-shaped.

17. The assembly of claim 15, wherein the adjustable heat pipe comprises a tubular structure, and wherein the adjustable heat pipe defines a distance between the first plate and the second plate, and wherein the distance is adjustable in a range of up to 1 mm.

18. The assembly of claim 15, further comprising a plurality of springs positioned between the first plate and the second plate.

19. The assembly of claim 18, wherein the third plate is coupled to the first plate in the absence of any springs therebetween.

20. The assembly of claim 1, further comprising an additional adjustable heat pipe positioned between the first plate and the third plate.

* * * * *